US012757612B2

(12) United States Patent
Lee et al.

(10) Patent No.: US 12,757,612 B2
(45) Date of Patent: Oct. 6, 2026

(54) DISPLAY DEVICE

(71) Applicant: Samsung Display Co., LTD., Yongin-si (KR)

(72) Inventors: Ju Hyun Lee, Yongin-si (KR); Hyun Eok Shin, Yongin-si (KR); Sung Joo Kwon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 449 days.

(21) Appl. No.: 18/200,430

(22) Filed: May 22, 2023

(65) Prior Publication Data

US 2024/0040898 A1 Feb. 1, 2024

(30) Foreign Application Priority Data

Jul. 27, 2022 (KR) ........................ 10-2022-0093253

(51) Int. Cl.

*H10K 59/80* (2023.01)
*H10K 59/00* (2023.01)
*H10K 59/12* (2023.01)
*H10K 59/35* (2023.01)

(52) U.S. Cl.

CPC ....... *H10K 59/80518* (2023.02); *H10K 59/35* (2023.02); *H10K 59/771* (2023.02); *H10K 59/876* (2023.02); *H10K 59/12* (2023.02)

(58) Field of Classification Search

CPC ............. H10K 59/80518; H10K 59/35; H10K 59/771; H10K 59/876; H10K 59/12; H10K 50/852; H10K 59/353; H10K 59/805; H10K 50/814; H10K 50/125; H10K 50/15; H10K 50/16; H10K 50/171; H10K 50/82; H10K 50/844; H10K 50/856

See application file for complete search history.

(56) References Cited

U.S. PATENT DOCUMENTS

| | | | |
|---|---|---|---|
| 7,750,554 B2 | 7/2010 | Shin | |
| 9,780,148 B2 | 10/2017 | Pyo et al. | |
| 10,283,570 B2 | 5/2019 | Pyo et al. | |

(Continued)

FOREIGN PATENT DOCUMENTS

| | | |
|---|---|---|
| JP | 2018142535 | 9/2018 |
| KR | 20060037857 A | 5/2006 |

(Continued)

*Primary Examiner* — Steven B Gauthier
*Assistant Examiner* — Alvin L Lee
(74) *Attorney, Agent, or Firm* — CANTOR COLBURN LLP

(57) ABSTRACT

A display device includes: a substrate including a first area, a second area and a third area; a first pixel electrode, a second pixel electrode and a third pixel electrode disposed in the first area, the second area and the third area, respectively, on the substrate; a sub-pixel electrode disposed on the third pixel electrode; a first emissive layer, a second emissive layer and a third emissive layer disposed on the first pixel electrode, the second pixel electrode and the sub-pixel electrode, respectively; and a common electrode disposed on entireties of the first emissive layer, the second emissive layer and the third emissive layer. The sub-pixel electrode includes an upper sub-electrode made of a transparent metal material and a lower sub-electrode having a distance-adjusting function.

21 Claims, 15 Drawing Sheets

(56) References Cited

U.S. PATENT DOCUMENTS

| | | | | |
|---|---|---|---|---|
| 10,505,134 | B2 | 12/2019 | Choi et al. | |
| 10,665,639 | B2 | 5/2020 | Pyo et al. | |
| 11,056,542 | B2 | 7/2021 | Pyo et al. | |
| 12,433,138 | B2 | 9/2025 | Hwang et al. | |
| 2006/0091791 | A1* | 5/2006 | Shin | C23C 28/345<br>313/506 |
| 2013/0048986 | A1* | 2/2013 | Lee | H10K 59/35<br>438/35 |
| 2016/0056214 | A1* | 2/2016 | Pyo | H10K 59/35<br>438/35 |
| 2020/0136095 | A1 | 4/2020 | Ju et al. | |
| 2025/0380598 | A1 | 12/2025 | Hwang et al. | |

FOREIGN PATENT DOCUMENTS

| | | | |
|---|---|---|---|
| KR | 20070098314 | | 10/2007 |
| KR | 20100118955 | | 11/2010 |
| KR | 20110065856 | | 6/2011 |
| KR | 101349143 | | 1/2014 |
| KR | 101582937 | | 1/2016 |
| KR | 20160022989 | A | 3/2016 |
| KR | 20190030809 | A | 3/2019 |
| KR | 20210080700 | A | 7/2021 |

* cited by examiner

DISPLAY DEVICE

This application claims priority to Korean Patent Application No. 10-2022-0093253, filed on Jul. 27, 2022, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

An organic light-emitting display device is a self-luminous display device that includes an anode, a cathode and organic films including an organic emissive layer between the electrodes and generates light by applying voltage to them so that electrons and holes recombine in the organic emissive layer. The organic light-emitting display device is lighter and thinner than a CRT and an LCD, and has many advantages such as wide viewing angle, fast response speed and low power consumption. Accordingly, the organic light-emitting display device is attracting attention as the next generation display device For a full-color organic light-emitting display device, there is a difference in luminous efficiency between different pixels, i.e., between different colors.

Specifically, among the red, green, and blue luminous materials, the green luminous material has the highest luminous efficiency, and the red luminous material has the second highest luminous efficiency. Accordingly, many attempts have been made to obtain the maximum efficiency and luminance by controlling the thickness of the organic films.

A fine metal mask is used in the process to form the organic films having different thicknesses for different pixels. However, such a process is a complicated, and defects such as stain defects and dark spots increase. As a result, there is a problem that the yield decreases.

SUMMARY

Aspects of the present disclosure provide a display device for reducing the defective rate by reducing the use of a fine metal mask in the process of an organic light-emitting element having a resonance structure.

According to the embodiments of the present disclosure, by reducing the number of fine metal masks used in the process, it is possible to effectively reduce the defective rate of an organic light-emitting display device.

According to an embodiment, a display device includes: a substrate including a first area, a second area and a third area; a first pixel electrode, a second pixel electrode and a third pixel electrode disposed in the first area, the second area and the third area, respectively, on the substrate; a sub-pixel electrode disposed on the third pixel electrode; a first emissive layer, a second emissive layer and a third emissive layer disposed on the first pixel electrode, the second pixel electrode and the sub-pixel electrode, respectively; and a common electrode disposed on entireties of the first emissive layer, the second emissive layer and the third emissive layer, where the sub-pixel electrode includes an upper sub-electrode made of a transparent metal material and a lower sub-electrode having a distance-adjusting function.

The upper sub-electrode may be made of indium tin oxide (ITO) or HITO.

The lower sub-electrode may be made of at least one of indium gallium zinc oxide (IGZO), indium zinc oxide (IZO), aluminum zinc oxide (AZO), and gallium zinc oxide (GZO).

The sub-pixel electrode may have a total thickness of about 300 angstroms (Å) to about 1,000 Å.

The first emissive layer, the second emissive layer and the third emissive layer may include a green emissive layer.

The third emissive layer may have a stack structure of the green emissive layer and a blue emissive layer.

The first emissive layer may have a stack structure of the green emissive layer and a red emissive layer, and wherein the second emissive layer may have a single-layer structure of the green emissive layer.

The pixel electrode may have a stack structure including a top pixel electrode and a lower pixel electrode, and the top pixel electrode may be made of a transparent conductive layer and disposed on a lower pixel electrode made of a metal material having relatively high reflectance.

The stack structure of the pixel electrode may further include a bottom pixel electrode made of a transparent conductive layer disposed under the lower pixel electrode.

The top pixel electrode may have a thickness of about 30 angstroms (Å) to about 300 Å.

The display device may further include: a hole common layer disposed under each of the first emissive layer, the second emissive layer, and the third emissive layer; and an electron common layer disposed on each of the first emissive layer, the second emissive layer and the third emissive layer.

The hole common layer may include at least one of a hole injection layer and a hole transport layer.

The electron common layer may include at least one of an electron injection layer and an electron transport layer.

The display device may further include a capping layer disposed on the common electrode.

According to an embodiment, a display device includes: a pixel electrode disposed on a substrate; a sub-pixel electrode disposed on the pixel electrode; a hole common layer disposed on the sub-pixel electrode; an emissive layer disposed on the hole common layer; an electron common layer disposed on the emissive layer; and a common electrode disposed on the electron common layer, where the emissive layer includes a first emissive layer and a second emissive layer disposed on the first emissive layer.

The first emissive layer may be a green emissive layer, and the second emissive layer may be a blue emissive layer.

The sub-pixel electrode may include an upper sub-electrode made of a transparent metal material and a lower sub-electrode having a distance-adjusting function.

The upper sub-electrode may be made of a transparent metal material including ITO or HITO.

The lower sub-electrode may be made of at least one of IGZO, IZO, AZO, and GZO.

The pixel electrode may have a stack structure including a top pixel electrode and a lower pixel electrode, and the top pixel electrode may be made of a transparent conductive layer and disposed on a lower pixel electrode made of a metal material having relatively high reflectance.

The stack structure of the pixel electrode may further include a bottom pixel electrode made of a transparent conductive layer disposed under the lower pixel electrode.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
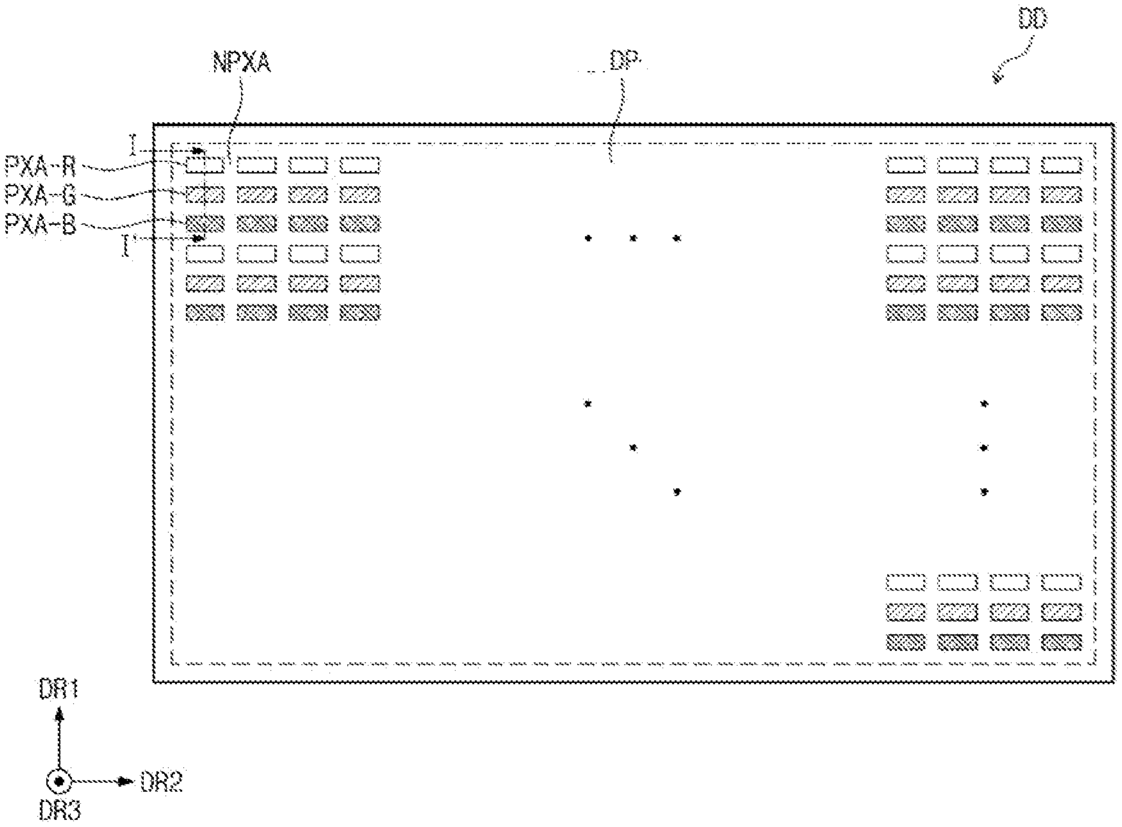
FIG. 1 is a plan view showing a display device DD according to an embodiment of the present disclosure.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, embodiments of the present disclosure will be described in detail with reference to the accompanying drawings.

FIG. 1 is a plan view showing a display device DD according to an embodiment of the present disclosure.

Referring to FIG. 1, a display device DD may display images on a display surface DP-IS. The image surface IS may be parallel to the plane defined by a first direction axis DR1 and a second direction axis DR2. A third direction axis DR3 may be perpendicular to the plane defined by the first direction axis DR1 and the second direction axis DR2. The third direction axis DR3 may be parallel to the thickness direction of the display device DD.

The display device DD may include a non-emission area NPXA and emission areas PXA-R, PXA-G and PXA-B. The emission areas PXA-R, PXA-G and PXA-B may be spaced apart from one another when viewed from the top (i.e., in a plan view). The emission areas PXA-R, PXA-G and PXA-B may emit different lights. The display device DD may include a red emission area PXA-R, a green emission area PXA-G, and a blue emission area PXA-B. In each of the emission areas PXA-R, PXA-G and PXA-B, light emitted from each of light-emitting elements 170 (see FIG. 2) may exit. The light-emitting elements 170 (see FIG. 2) will be described in detail later.

Although the emission areas PXA-R, PXA-G and PXA-B all have a similar area in the example shown in FIG. 1, the embodiments of the present disclosure are not limited thereto. The emission areas PXA-R, PXA-G and PXA-B may have different areas depending on wavelength bands of emitted lights. The areas of the emission areas PXA-R, PXA-G and PXA-B may refer to the areas when viewed on the plane defined by the first direction axis DR1 and the second direction axis DR2 (i.e., in a plan view).

The arrangement of the emission areas PXA-R, PXA-G and PXA-B is not limited to that shown in FIG. 1. According to an embodiment of the present disclosure, the emission areas PXA-R, PXA-G and PXA-B may be referred to as a first emission area, a second emission area and a third emission area, respectively. In another embodiment, the order of the emission areas PXA-R, PXA-G and PXA-B, i.e., red emission areas PXA-R, green emission areas PXA-G and blue emission areas PXA-B may be provided in various combinations according to characteristics of the display quality required by the display device DD. For example, the arrangement of the emission areas PXA-R, PXA-G and PXA-B may be a PenTile pattern or a diamond pattern.

In addition, the emission areas PXA-R, PXA-G and PXA-B may have different areas. For example, according to an embodiment of the present disclosure, the green emission areas PXA-G may be smaller than the blue emission areas PXA-B. It should be understood, however, that the present disclosure is not limited thereto.

Figure 2:
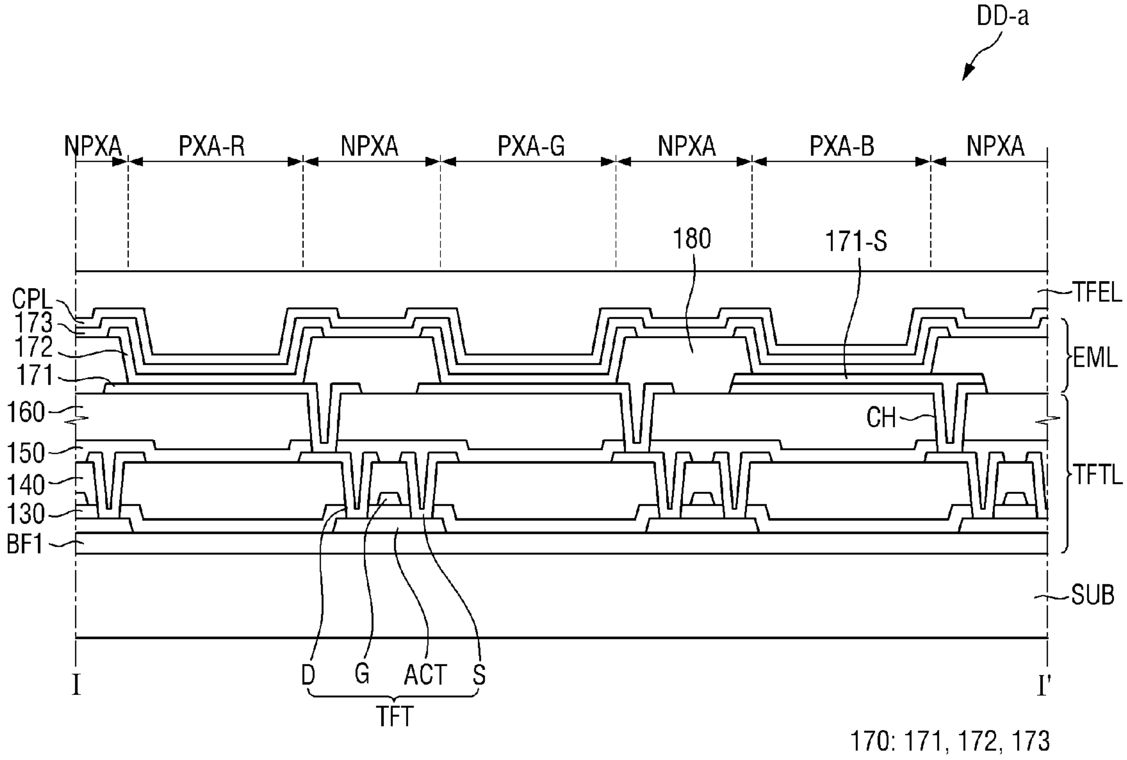
FIG. 2 is a cross-sectional view taken along line I-I' of FIG. 1.

FIG. 2 is a cross-sectional view taken along line I-I' of FIG. 1.

Referring to FIG. 2, the display device DD includes a substrate SUB including a first area, a second area, and a third area. The first area, the second area, and the third area correspond to the red emission area PXA-R, the green emission area PXA-G, and the blue emission area PXA-B, respectively. Hereinafter, corresponding reference characters PXA-R, PXA-G, and PXA-B are used for the first area, the second area, and the third area, respectively.

The first areas PXA-R, the second areas PXA-G and the third areas PXA-B may include light-emitting elements that emit light having different wavelengths from each other. Lights having different wavelengths have different resonance distances.

The substrate SUB may be made of an insulating material selected from the group consisting of: glass, quartz, ceramic, and plastic. It should be understood, however, that the present disclosure is not limited thereto.

A thin-film transistor layer TFTL is disposed on the substrate SUB. The thin-film transistor layer TFTL includes thin-film transistors TFT, a gate insulator 130, an interlayer-dielectric layer 140, a protective layer 150, and a planarization layer 160.

A buffer layer BF1 may be disposed on a surface of the substrate SUB. The buffer layer BF1 may be disposed on one surface of the substrate SUB in order to protect the thin-film transistors TFT and an emissive layer 172 of an emission material layer EML from moisture that is likely to permeate through the substrate SUB. The buffer layer BF may be formed of or include a plurality of inorganic layers stacked on one another alternately. For example, the buffer layer BF1 may be multiple layers in which one or more inorganic layers of a silicon nitride layer, a silicon oxynitride layer, a silicon oxide layer, a titanium oxide layer, and an aluminum oxide layer are alternately stacked on one another. The buffer layer BF1 may be eliminated.

A thin-film transistor TFT is disposed on the buffer layer BF1. The thin-film transistor TFT may include an active layer ACT, a gate electrode G, a source electrode S, and a drain electrode D. In FIG. 2, the thin-film transistor TFT is implemented as a top-gate transistor in which the gate electrode G is located above the active layer ACT. It is, however, to be understood that the present disclosure is not limited thereto. That is to say, each of the thin-film transistors TFT may be implemented as a bottom-gate transistor in which the gate electrode G is located below the active layer ACT, or as a double-gate transistor in which the gate electrodes G are disposed above and below the active layer ACT.

The active layer ACT is disposed on the buffer layer BF1. The active layer ACT may include polycrystalline silicon, single crystal silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. For example, the active layer ACT may include an oxide including indium, tin, and titanium ("ITZO") or an oxide including indium, gallium, and zinc ("IGZO"). A light-blocking layer for blocking outside light incident on the active layer ACT may be disposed between the buffer layer and the active layer ACT.

The gate insulator 130 may be disposed on the active layer ACT. The gate insulator 130 may be formed of an inorganic layer, for example, a silicon nitride layer, a silicon oxynitride layer, a silicon oxide layer, a titanium oxide layer, or an aluminum oxide layer.

The gate electrode G and gate lines may be disposed on the gate insulator 130. The gate electrode G and the gate lines may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The interlayer-dielectric layer 140 may be formed over the gate electrode G and the gate lines. The interlayer-dielectric layer 140 may be formed of or include an inorganic layer, for example, a silicon nitride layer, a silicon oxynitride layer, a silicon oxide layer, a titanium oxide layer, or an aluminum oxide layer.

The source electrode S and the drain electrode D may be disposed on the interlayer-dielectric layer 140. Each of the source electrode S and the drain electrode D may be connected to the active layer ACT through a contact hole penetrating through the gate insulator 130 and the interlayer-dielectric layer 140. The source electrode S and the drain electrode D may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The protective layer 150 may be formed over the source electrode S and the drain electrode D in order to insulate the thin-film transistor TFT. The protective layer 150 may be formed of or include an inorganic layer, for example, a silicon nitride layer, a silicon oxynitride layer, a silicon oxide layer, a titanium oxide layer, or an aluminum oxide layer.

The planarization layer 160 may be disposed on the protective layer 150 to provide a flat surface over the step differences of the thin-film transistors TFT. The planarization layer 160 may be formed of or include an organic layer such as an acryl resin, an epoxy resin, a phenolic resin, a polyamide resin, and a polyimide resin.

The emission material layer EML may be disposed on the planarization layer 160. The emission material layer EML may include the light-emitting elements 170 and a pixel-defining layer 180.

The light-emitting elements 170 and the pixel-defining layer 180 may be disposed on a planarization layer 160. The light-emitting element 170 may be an organic light-emitting device. Each of the light-emitting elements 170 may include a pixel electrode 171, an emissive layer 172, and a common electrode 173. The common electrode 173 may be commonly connected to the plurality of light-emitting elements 170.

The pixel electrode 171 may be disposed on the planarization layer 160. According to an embodiment of the present disclosure, the pixel electrode 171 may be an anode electrode. When the pixel electrode 171 is an anode electrode, the pixel electrode 171 may include a reflective material. The reflective material may include, for example, a reflective layer made of at least one selected from the group consisting of: silver (Ag), magnesium (Mg), chromium (Cr), gold (Au), platinum (Pt), nickel (Ni), copper (Cu), tungsten (W) and aluminum (Al), and a transparent or translucent electrode disposed on the reflective layer.

The transparent or transflective electrode may be made of at least one selected from the group consisting of: indium tin oxide ("ITO"), indium zinc oxide ("IZO"), zinc oxide (ZnO), indium oxide ($In_2O_3$), indium gallium oxide ("IGO"), and aluminum zinc oxide ("AZO").

A sub-pixel electrode 171-S may be disposed on the pixel electrode 171 in the third area PXA-B.

The sub-pixel electrode 171-S may be disposed to set the resonance distance of light emitted from the emissive layer 172-3 in the third area PXA-B.

A contact hole CH may be defined in the planarization layer 160. The contact hole CH may be formed to expose the drain electrode D of the thin-film transistor TFT. The pixel electrode 171 may be connected to the drain electrode D of the thin-film transistor TFT through the contact hole CH.

The pixel-defining layer 180 may distinguish between light-emitting elements 170 disposed on the substrate SUB, and thus may define emission areas. In addition, the pixel-defining layer 180 may be disposed to cover the edges of the pixel electrode 171 and the sub-pixel electrode 171-S. In each of the pixels, the pixel electrode 171, the emissive layer 172 and the common electrode 173 are stacked on one another sequentially, so that holes from the pixel electrode 171 and electrons from the common electrode 173 are combined with each other in the emissive layer 172 to emit light.

The emissive layers 172 are disposed on the pixel electrodes 171 and the pixel-defining layer 180. For convenience of illustration, an emissive layer formed in the first area PXA-R is referred to as a first emissive layer 172-1, an emissive layer formed in the second area PXA-G is referred to as a second emissive layer 172-2, and an emissive layer formed in the third area PXA-B is referred to as a third emissive layer 172-3.

The emissive layers 172 may be organic emissive layers. For example, the emissive layer 172 may emit one of red light, green light, and blue light. The wavelength of the red light may range from approximately 620 to 750 nanometers (nm), and the wavelength of the green light may range from approximately 495 to 570 nm. Further, the wavelength of the blue light may range from approximately 450 to 495 nm.

The emissive layer 172 may be a multi-layer structure including a hole transporting layer, an organic light-emitting layer, an electron transporting layer, etc. Such a structure will be described in detail below with reference to FIGS. 4 to 6.

The common electrode 173 may be disposed on the emissive layer 172. According to an embodiment of the present disclosure, the common electrode 173 may be disposed on an entirety of the emissive layer 172 and the pixel-defining layer 180. The common electrode 173 may be a common layer formed across all of the light-emitting elements 170. In an embodiment, the common electrode 173 may be a cathode electrode. In an embodiment, the common electrode 173 may include at least one selected from the group consisting of: Li, Ca, LiF/Ca, LiF/Al, Al, Ag and Mg. In addition, the common electrode 173 may be made of a metal thin film having a low work function. In an embodiment, the common electrode 173 may be made of at least one selected from the group consisting of: indium tin oxide (ITO), indium zinc oxide (IZO), zinc oxide (ZnO), indium oxide ($In_2O_3$), indium gallium oxide (IGO), and aluminum zinc oxide (AZO).

In the top-emission structure, the common electrode 173 may be formed of or include a transparent conductive oxide (TCO) such as indium tin oxide (ITO) and indium zinc oxide (IZO) that can transmit light, or a semi-transmissive conductive material such as magnesium (Mg), silver (Ag) and an alloy of magnesium (Mg) and silver (Ag). When the common electrode 173 is formed of or includes a semi-transmissive metal material, the light extraction efficiency can be increased by using microcavities.

A capping layer CPL may be disposed on the common electrode 173. The capping layer CPL protects the light-emitting elements 170 and also facilitates the lights generated in the emissive layers 172 to efficiently exit to the outside. In particular, the capping layer CPL can prevent loss of lights at the common electrode 173 by total reflection of the lights in the top-emission organic light-emitting elements. In addition, if a difference in refractive index between the capping layer CPL and the material on the capping layer CPL is large, the upper surface of the capping layer CPL acts as a semi-transmissive film. Accordingly, lights may be repeatedly reflected between the pixel electrodes 171 and the upper surface of the capping layer CPL, so that light resonance may occur.

The capping layer CPL may cover the entire common electrode 173. The material of the capping layer CPL is not particularly limited as long as it is typically used to form the capping layer CPL in the art.

An encapsulation layer TFEL may be disposed on the capping layer CPL. The encapsulation layer TFEL is disposed on the common electrode 173. The encapsulation layer TFEL may include at least one inorganic layer to prevent oxygen or moisture from permeating into the emissive layers 172 and the common electrode 173. In addition, the encapsulation layer TFEL may include at least one organic film to protect the emission material layer EML from particles such as dust. For example, the encapsulation layer TFEL may include a first inorganic layer TFE1 disposed on the common electrode 173, an organic layer TFE2 disposed on the first inorganic layer TFE1, and a second inorganic layer TFE3 disposed on the organic layer TFE2. The first inorganic layer TFE1 and the second inorganic layer TFE3 may be formed of or include, but is not limited to, a silicon nitride layer, a silicon oxynitride layer, a silicon oxide layer, a titanium oxide layer, or an aluminum oxide layer. The organic film may be formed of or include, but is not limited to, an acryl resin, an epoxy resin, a phenolic resin, a polyamide resin, a polyimide resin, etc.

A second buffer layer (not shown) is disposed on the encapsulation layer TFEL. The second buffer layer (not shown) may be multiple inorganic layers sequentially stacked on one another. For example, the second buffer layer (not shown) may be multiple layers in which one or more inorganic layers of a silicon nitride layer, a silicon oxynitride layer, a silicon oxide layer, a titanium oxide layer, and an aluminum oxide layer are alternately stacked on one another. The second buffer layer (not shown) may be eliminated.

Although not shown in the drawings, additional color filters for displaying red, green, and blue colors, respectively, may be further disposed on the capping layer CPL.

Figure 3:
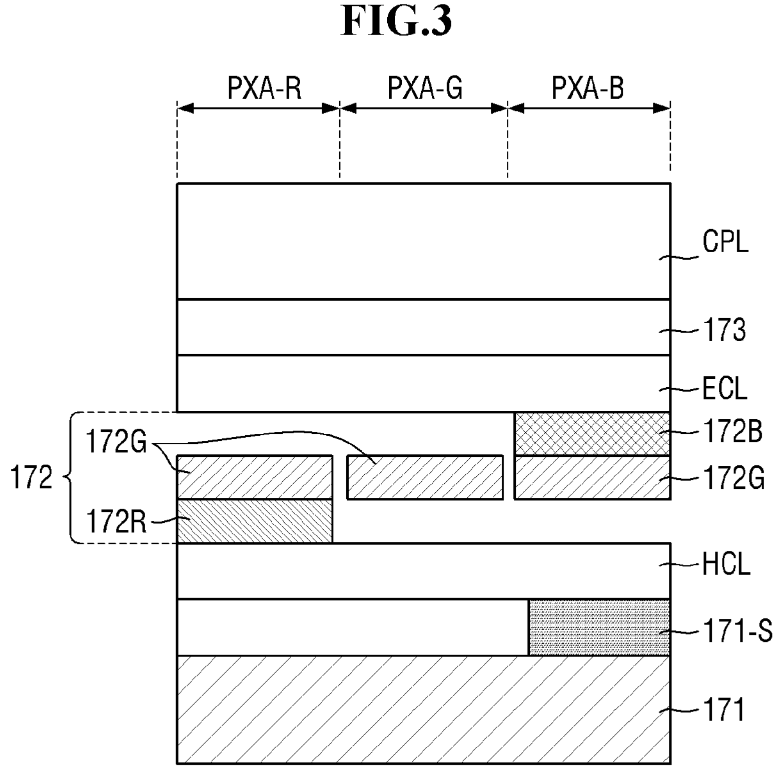
FIG. 3 is a schematic view of the organic light-emitting display device of FIG. 2.
Figure 4:
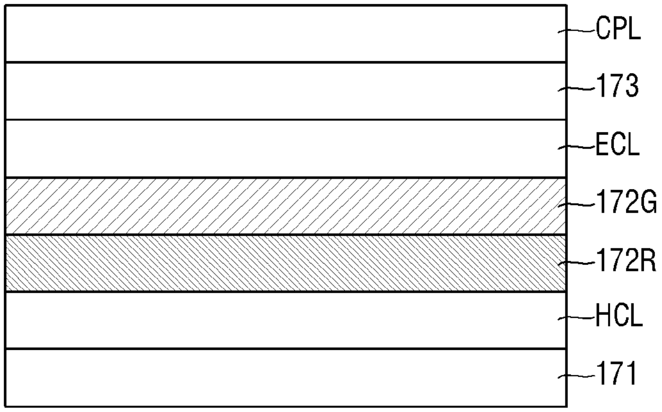
FIG. 4 is a view showing a stack structure of a first emission area.
Figure 5:
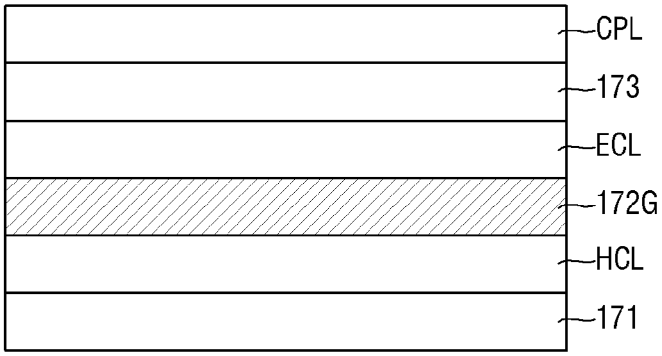
FIG. 5 is a view showing a stack structure of a second emission area.
Figure 6:
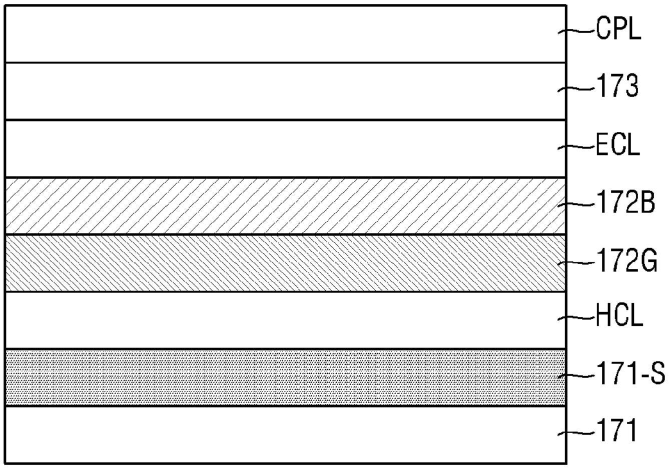
FIG. 6 is a view showing a stack structure of a third emission area.
Figure 7:
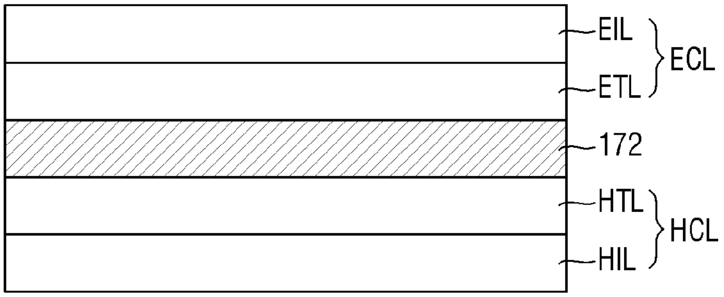
FIG. 7 is a view showing a stack structure of an electron common layer and a hole common layer according to an embodiment.
Figure 8:
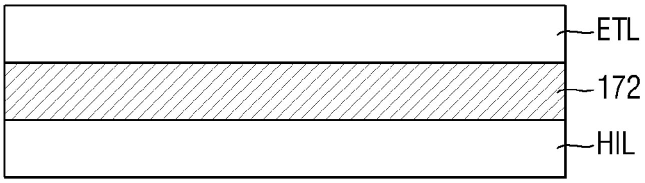
FIG. 8 is a view showing a stack structure of an electron common layer and a hole common layer according to another embodiment.
Figure 9:
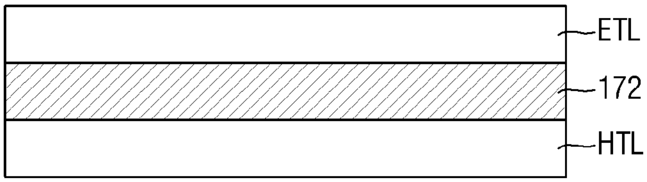
FIG. 9 is a view showing a stack structure of an electron common layer and a hole common layer according to yet another embodiment.

FIG. 3 is a schematic view of the organic light-emitting display device of FIG. 2. FIG. 4 is a view showing a stack structure of a first emission area. FIG. 5 is a view showing a stack structure of a second emission area. FIG. 6 is a view showing a stack structure of a third emission area. FIG. 7 is a view showing a stack structure of an electron common layer and a hole common layer according to an embodiment. FIG. 8 is a view showing a stack structure of an electron common layer and a hole common layer according to another embodiment. FIG. 9 is a view showing a stack structure of an electron common layer and a hole common layer according to yet another embodiment.

Referring to FIG. 3, the organic light-emitting display device DD may include the first area PXA-R, the second area PXA-G, and the third area PXA-B.

According to the embodiment of the present disclosure, the first area PXA-R may be a red emission area, the second area PXA-G may be a green emission area, and the third area PXA-B may be a blue emission area. In the following description, the first area PXA-R is referred to as a red emission area, the second area PXA-G is referred to as a green emission area, and the third area PXA-B is referred to as a blue emission area, for convenience of illustration.

In the red emission area PXA-R, the green emission area PXA-G and the blue emission area PXA-B, a pixel electrode 171, a hole common layer HCL, an emissive layer 172, an electron common layer ECL, a common electrode 173 and a capping layer CPL are commonly disposed.

In the blue emission area PXA-B, a sub-pixel electrode 171-S is further disposed on the pixel electrode 171. The sub-pixel electrode 171-S works as a distance-adjusting layer of the blue emission area PXA-B.

The emissive layer 172 includes a luminous material that produces a particular color. For example, the emissive layer 172 may produce primary colors such as red, green, and blue or combinations thereof. The emissive layer 172 includes a host and a dopant.

Referring to FIGS. 3 and 4, When the emissive layer 172 is a red emissive layer 172R that emits red light, it may include, for example, a host material such as CBP (carbazole biphenyl) or mCP(1,3-bis(carbazol-9-yl), and may be made of a phosphorescent material including a dopant including one or more selected from the group consisting of: PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum). Alternatively, it may be made of, but is not limited to, a fluorescent material including PBD:Eu(DBM)3(Phen) or perylene.

The thickness of the red emissive layer 172R is determined based on the resonance distance of the red light. That is to say, the red emissive layer 172R of the red emission area PXA-R may work as a distance-adjusting layer.

Referring to FIGS. 3 and 5, when the emissive layer 172 is a green emissive layer 172G that emits green light, it may include a host material including CBP or mCP, may be made of a phosphor containing a dopant material including Ir(ppy)3(fac-tris(2-phenylpyridine)iridium). Alternatively, it may be made of, but is not limited to, a fluorescent material including Alq3(tris(8-hydroxyquinolino)aluminum).

Referring to FIGS. 3 and 6, when the emissive layer 172 is a blue emissive layer 172B that emits blue light, it may include a host material including CBP or mCP, and may be made of a phosphor containing a dopant material including (4,6-F2ppy)2Irpic. Alternatively, the blue emissive layer 172B may be made of, but is not limited to, a fluorescent material including one selected from the group consisting of spiro-DPVBi, spiro-6P, distytylbenzene ("DSB"), distyrylarylene ("DSA"), a PFO-based polymer, and a PPV-based polymer.

Referring back to FIG. 3, the emissive layer 172 of each of the emission areas may have a single-layer structure or a stack structure in which two or more luminous material layers are stacked on one another. For example, the emissive layer 172 of the red emission area PXA-R may have a stack structure of the green emissive layer 172G and the red emissive layer 172R. The green emissive layer 172G may be disposed on the red emissive layer 172R, but the present disclosure is not limited thereto.

The emissive layer 172 of the green emission area PXA-G may have a single-layer structure including the green emissive layer 172G.

The emissive layer 172 of the blue emission area PXA-B may have a stack structure of the green emissive layer 172G and the blue emissive layer 172B. The blue emissive layer 172B may be disposed on the green emissive layer 172G, but the present disclosure is not limited thereto.

The hole common layer HCL includes a hole injection layer HIL and a hole transport layer HTL. The electron common layer ECL facilitates the movement of electrons and may include at least one of the electron injection layer EIL and the electron transport layer ETL.

Referring to FIGS. 6 and 7, the hole transport layer HTL may be disposed on the hole injection layer HIL, and the emissive layer 172 may be disposed on the hole transport layer HTL. The electron transport layer ETL may be disposed on the emissive layer 172, and the electron injection layer EIL may be disposed on the electron transport layer ETL.

The hole injection layer HIL improves injection of holes from the pixel electrode 171.

The hole transport layer HTL may facilitate transport of holes. The hole transport layer HTL may include an organic material.

The thickness of the hole transport layer HTL may range from, but is not limited to, about 15 nm to about 25 nm.

The electron injection layer EIL improves injection of electrons from the common electrode 173.

The electron transport layer ETL may transport the electrons injected from the common electrode 173 to the emissive layer 172. In addition, the electron transport layer ETL can prevent holes injected from the pixel electrode 171 from passing through the emissive layer 172 to move to the common electrode 173. That is to say, the electron transport layer ETL works as a hole blocking layer, and facilitates the combination of holes and electrons in the emissive layer 172. The electron transport layer 177 may include an organic material.

According to another embodiment, the emissive layer 172 may be disposed on the hole injection layer HIL, and the electron transport layer ETL may be disposed on the emissive layer 172, as shown in FIG. 8. The function of each of the layers has been described above; and, therefore, the redundant descriptions will be omitted.

According to yet another embodiment, the emissive layer 172 may be disposed on the hole transport layer HTL, and the electron transport layer ETL may be disposed on the emissive layer 172, as shown in FIG. 9. The function of each of the layers has been described above; and, therefore, the redundant descriptions will be omitted.

Figure 10:
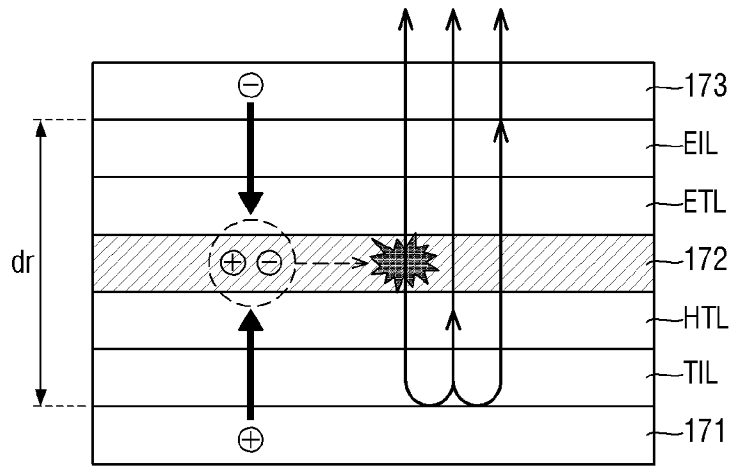
FIG. 10 is a view for conceptually illustrating resonance occurring in a light-emitting element.

FIG. 10 is a view for conceptually illustrating resonance occurring in a light-emitting element.

As shown in FIG. 10, light generated in the emissive layer 172 transmits and is reflected at various interfaces. In doing so, an interference phenomenon may occur. The light that spreads out to the lower side of the emissive layer 172 hits the metal layer of the pixel electrode 171 and is reflected upward, while the light that spreads out to the upper side hits the common electrode 173. In a top-emission light-emitting element, lights exit upward. Some of the lights reaching the common electrode 173 exits to the outside, while some others are reflected again and go down. Such reflected lights interfere with each other. When this happens, constructive interference occurs and resonance occurs. A distance between the top of the pixel electrode 171 and the bottom of the common electrode 173 is referred to as a resonance distance dr. In order to cause constructive interference of light, a resonance distance suitable for the wavelength of each light is required. When an auxiliary layer for adjusting the resonance distance is disposed on the emissive layer 172 in order to set the resonance distance of the light-emitting element, a fine resonance mask should be added. Herein, the resonance distance of light can be adjusted by adjusting the thickness of the sub-pixel electrode.

According to an embodiment of the present disclosure, the resonance distance dr is adjusted by the sub-pixel electrode 171-S on the pixel electrode 171.

Figure 11:
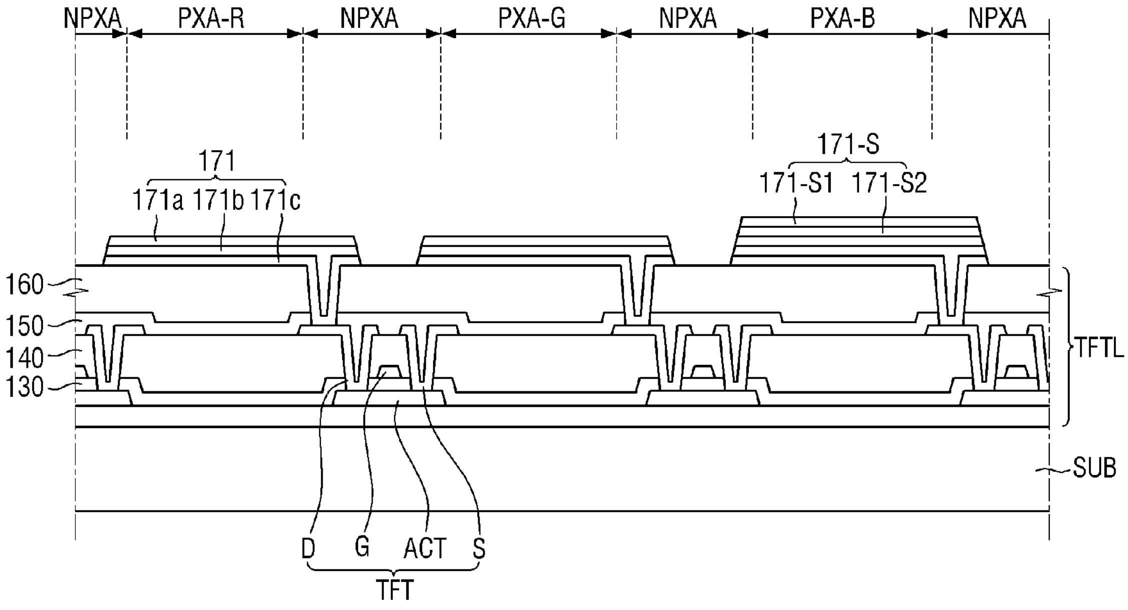
FIG. 11 is an example of pixel electrodes and a sub-pixel electrode disposed in emission areas according to an embodiment.
Figure 12:
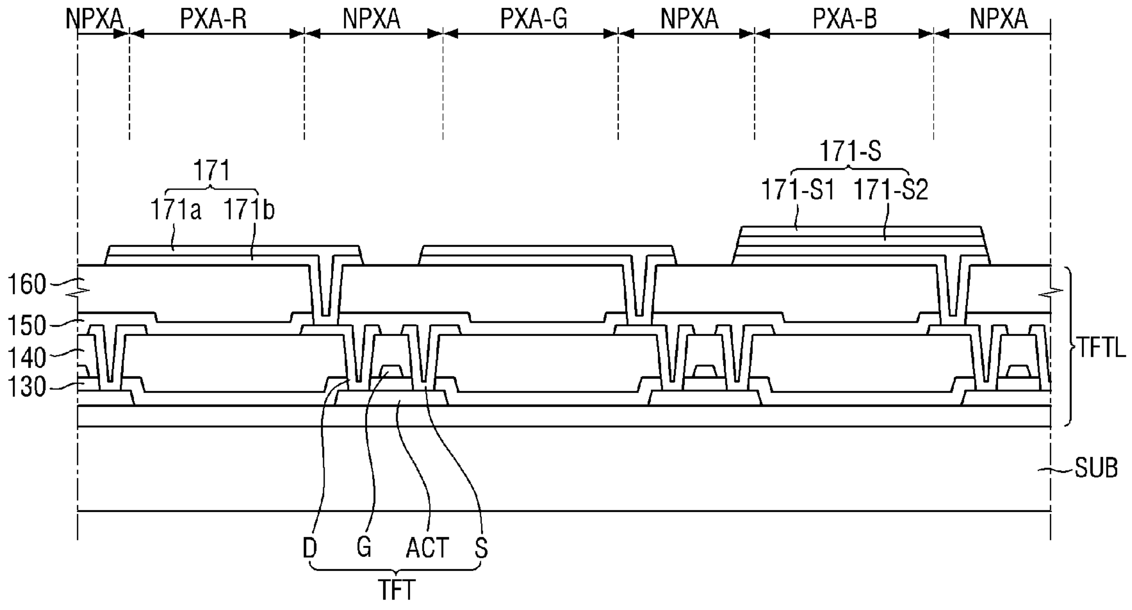
FIG. 12 is an example of pixel electrodes and a sub-pixel electrode disposed in emission areas according to another embodiment.

FIG. 11 is an example of pixel electrodes and a sub-pixel electrode disposed in emission areas according to an embodiment. FIG. 12 is an example of pixel electrodes and a sub-pixel electrode disposed in emission areas according to another embodiment.

FIG. 11 shows an example of pixel electrodes 171 and a sub-pixel electrode 171-S disposed in the emission areas PXA-R, PXA-G and PXA-B according to an embodiment.

The pixel electrode 171 may have a triple-layer structure in which a top pixel electrode 171*a* made of a transparent conductive layer and disposed at the top, a lower pixel electrode 171*b* made of a metal material having relatively high reflectance and disposed under the top pixel electrode 171*a*, and a bottom pixel electrode 171*c* made of a transparent conductive layer and disposed under the lower pixel electrode 171*b* are stacked on one another. In a modification, the bottom pixel electrode 171*c* may be omitted as shown in FIG. 12. "Relatively high reflectance" as used herein is a value known to one of ordinary skill in the art such that lights may be repeatedly reflected between the pixel electrodes 171 and the upper surface of the capping layer CPL.

The top pixel electrode 171*a* and the bottom pixel electrode 171*c* may include at least one selected from the group consisting of: indium tin oxide (ITO), indium zinc oxide (IZO), zinc oxide (ZnO), indium oxide ($In_2O_3$), indium gallium oxide (IGO) and aluminum zinc oxide (AZO). The top pixel electrode 171*a* and the bottom pixel electrode 171*c* may be made of, but is not limited to, the same material. In particular, when the top pixel electrode 171*a* is made of indium tin oxide (ITO), it may be crystallized by heat treatment prior to the process of the sub-pixel electrode 171-S.

Accordingly, it is possible to prevent defects on the upper surface of the top pixel electrode 171*a* during the process of etching the sub-pixel electrode 171-S. This will be described in detail later with reference to FIG. 16.

The lower pixel electrode 171*b* may include at least one selected from the group consisting of: Ag, Al, Mg, Li, Ca, Cu, LiF/Ca, LiF/Al, MgAg, and CaAg.

The top pixel electrode 171 *a* and the bottom pixel electrode 171 *c* may have a total thickness of about 30 Å to about 300 Å. The top pixel electrode 171 *a* may have a thickness of about 30 Å to about 100 Å in consideration of the electron supply function.

The sub-pixel electrode 171-S includes an upper sub-electrode 171-51 and a lower sub-electrode 171-S2. The lower sub-electrode 171-S2 is disposed on the pixel electrode 171. In the third area PXA-B, the lower sub-electrodes 171-S2 is disposed on the top pixel electrode 171*a*, and the upper sub-electrode 171-S1 is disposed on the lower sub-electrodes 171-S2.

The upper sub-electrodes 171-51 may be made of a transparent metal material including ITO or HITO. The upper sub-electrode 171-S1 has a relatively high work function.

The lower sub-electrode 171-S2 may be formed of or includes at least one of IGZO, IZO, AZO and gallium zinc oxide (GZO) and have a function of adjusting the resonance distance.

The sub-pixel electrode 171-S may have a total thickness of about 300 Å to about 1,000 Å. The upper sub-electrodes 171-51 may have a thickness of about 30 Å to about 300 Å.

FIGS. 13 to 20 are cross-sectional views for illustrating a method of forming a pixel electrode and a sub-pixel electrode.

Figure 13:
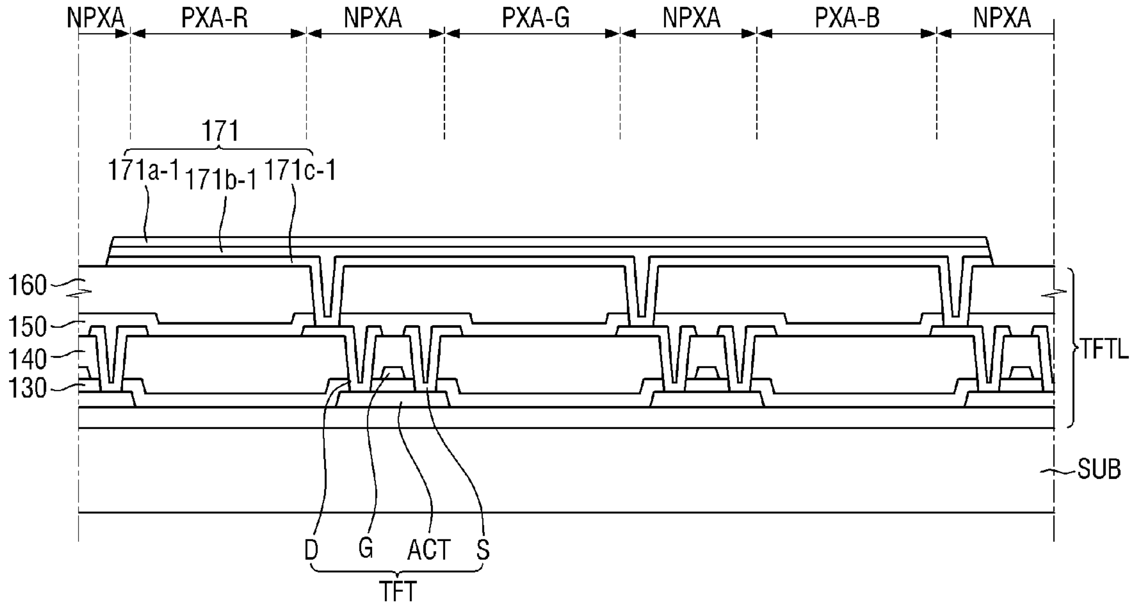
FIGS. 13 to 20 are cross-sectional views for illustrating a method of forming a pixel electrode and a sub-pixel electrode.
Figure 14:
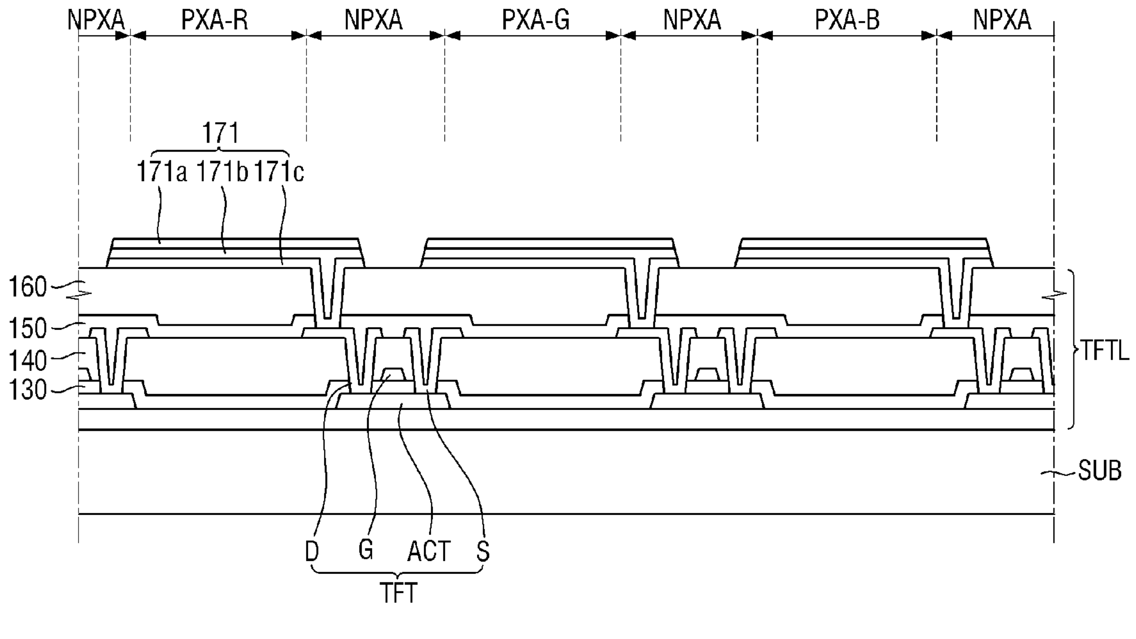

Referring to FIGS. 13 and 14, a pixel electrode 171 is formed in each emission area.

More specifically, referring to FIG. 13, a transparent conductive layer such as ITO is deposited on a planarization layer 160 as a pixel electrode material 171*c*-1. Subsequently, a metal material 171*b*-1 having relatively high reflectance is disposed on the bottom pixel electrode 171*c*, and a pixel electrode material 171*a*-1 is deposited on the metal material 171*b*-1. Subsequently, a photoresist film pattern is formed as a mask pattern on the emission areas of the pixel electrode material 171*a*-1. Subsequently, referring to FIG. 14, the pixel electrode materials 171*a*-1 and 171*c*-1 and the metal material 171*b*-1 are etched using the photoresist film pattern to form the pixel electrode 171. Subsequently, the photoresist film pattern may be removed by performing a lift-off process. After the pixel electrode 171 has been formed, heat treatment is carried out on the top pixel electrode 171*a*. By performing the heat treatment on the top pixel electrode 171*a*, ITO is crystallized. During the subsequent etching of the sub-pixel electrode 171-S of the third area PXA-B, the crystallized top pixel electrode 171*a* of the first area PXA-R and the pixel electrode 171 of the second emission area PXA-G are not damaged. According to the embodiment of the present disclosure, the pixel electrode 171 has a triple-layer structure, but the present disclosure is not limited thereto. The pixel electrode 171 may have a double-layer structure in which a pixel electrode material is deposited on a metal material. The first emission area may be a red emission area, and the second emission area may be a green emission area.

Figure 15:
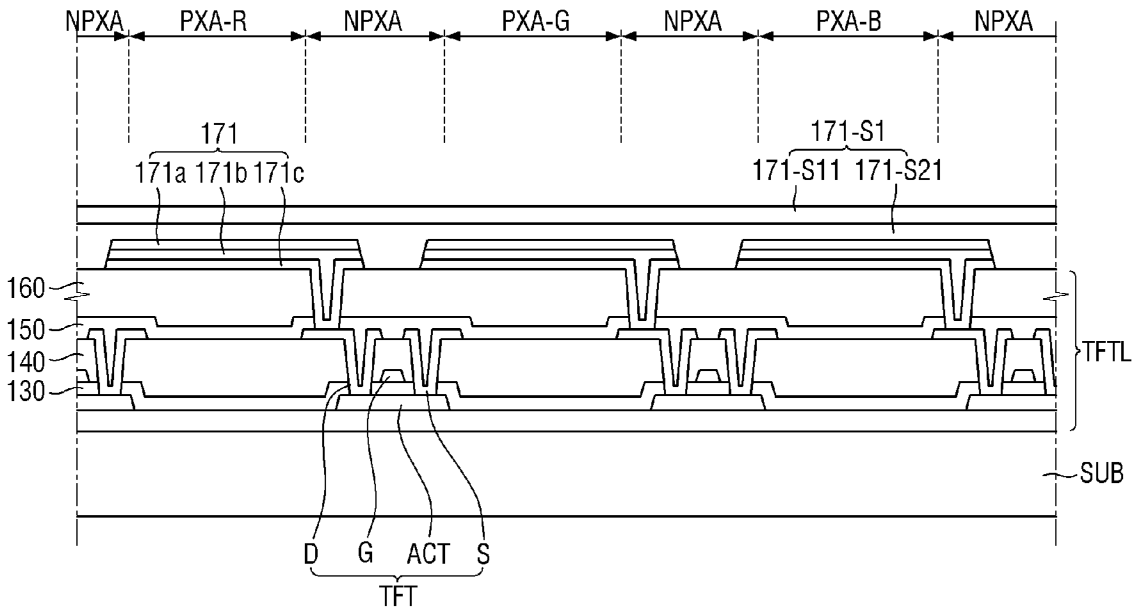
Figure 16:
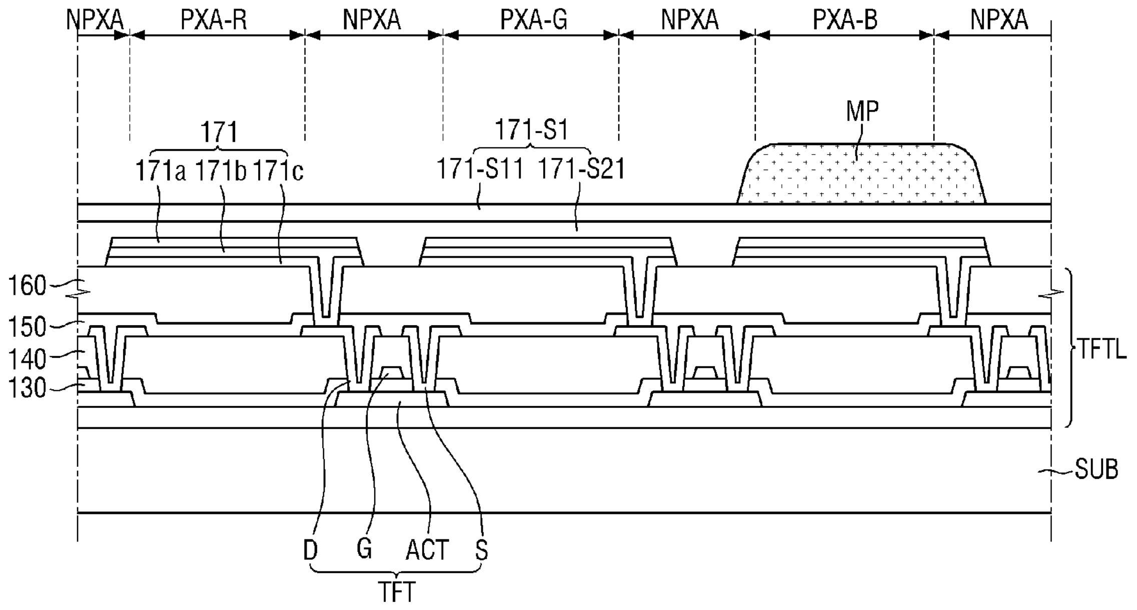
Figure 17:
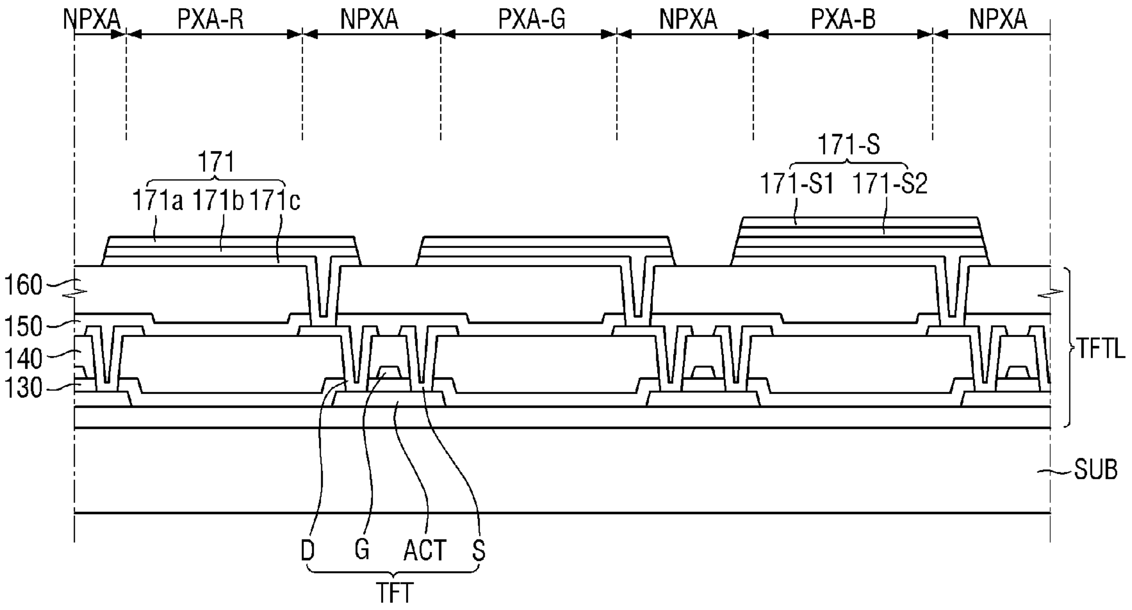

As shown in FIGS. 15 to 17, a sub-pixel electrode 171-S is disposed on the pixel electrode 171 on the third emission area. The third emission area may be a blue emission area.

More specifically, referring to FIG. 15, a lower sub-electrode material 171-S21 having a resonance-distance-adjusting function is deposited on the top pixel electrode 171*a*. The lower sub-electrode material 171-S21 may be formed of or include, for example, at least one of IGZO, IZO, AZO, and GZO. The lower sub-electrode material 171-S21 may be an amorphous transparent conductive oxide (TCO), or a transparent conductive oxide (TCO) that is crystalline and has an etchable zinc oxide. The thickness of the lower sub-electrode material may be adjusted in consideration of the resonance distance of the emissive layer of the third emission area. Subsequently, an upper sub-electrode material 171-S11, which is a transparent conductive layer such as ITO, is deposited on the lower sub-electrode material 171-S21. The upper sub-electrode material 171-S11 may be the same pixel electrode material as the pixel electrode material forming the upper pixel electrode.

Subsequently, a photoresist film pattern is disposed on the sub-pixel electrode material of the third emission area as a mask pattern MP. Subsequently, referring to FIGS. 16 and 17, the pixel electrode material is etched using the photoresist film pattern to form the sub-pixel electrode 171-S. Subsequently, the photoresist film pattern may be removed by performing a lift-off process.

Figure 18:
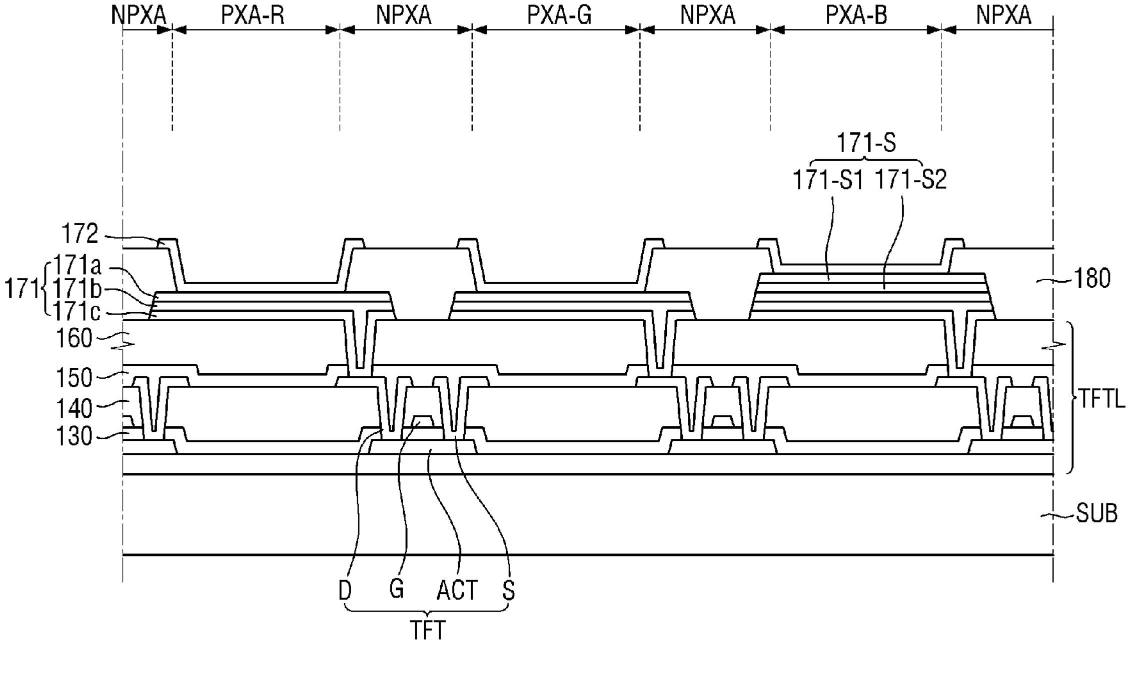

Subsequently, with reference to FIGS. 18 and 3, a pixel-defining layer 180 and an emissive layer 172 are disposed on the pixel electrode 171 and the sub-pixel electrode 171-S disposed on the substrate SUB. More specifically, a photosensitive organic material is applied over the entire surface of the planarization layer 160 to form an organic material layer (not shown) for a pixel-defining layer, and a photolithography process is carried out using a pattern mask. A part of the organic material layer for forming the pixel-defining layer that is exposed to light is removed during the developing process, while the unexposed part is left after the developing process. It should be noted that an exposed part may remain while an unexposed part may be removed depending on the type of the photosensitive organic material. Subsequently, the developing process is carried out, so that the pixel-defining layer 180 is formed. In doing so, thermal curing or photocuring may be carried out to make the pixel-defining layer 180 stable. An opening of the pixel-defining layer 180 disposed on the pixel electrode 171 corresponds to a pixel area.

The emissive layer 172 is disposed on the pixel electrode 171 exposed through the opening of the pixel-defining layer 180. More specifically, a red emissive layer is formed in the first area PXA-R using a first fine metal mask, and a green emissive layer 172G is formed in a first area PXA-R, a second area PXA-R and a third area PXA-B using a second fine metal mask. Subsequently, a blue emissive layer 172B is formed in the third area PXA-B using a third fine metal mask.

Figure 19:
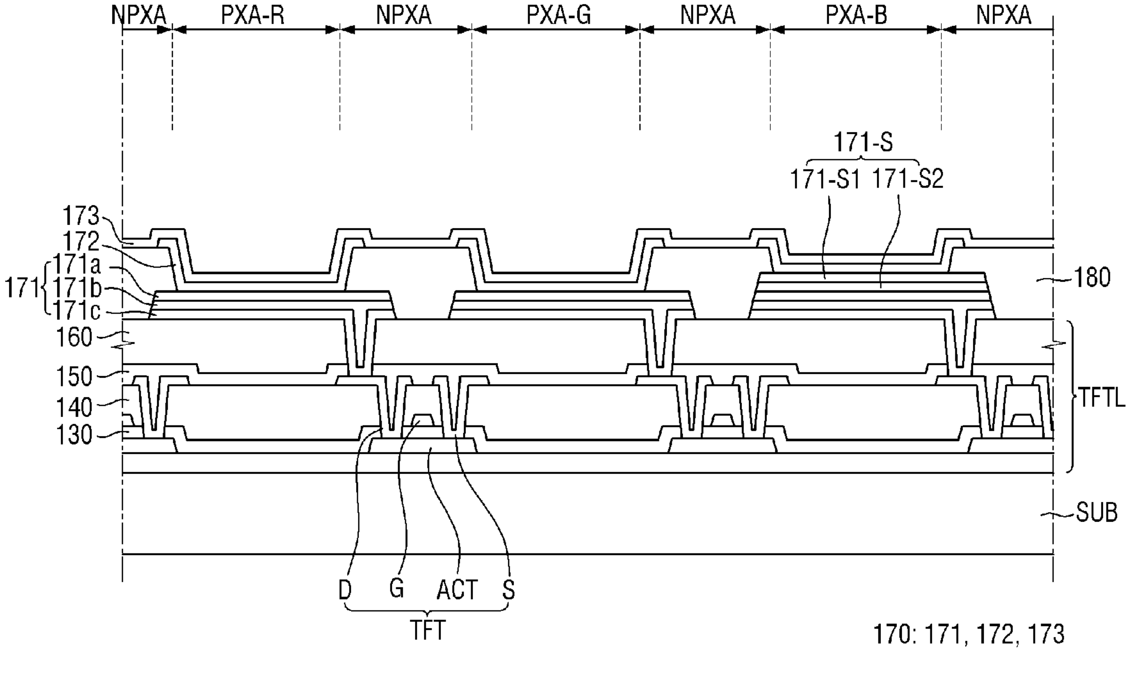

Referring to FIG. 19, a common electrode 173 is formed on the emissive layers 172 and the pixel-defining layer 180. The common electrode 173 is formed to cover all of the emission areas.

Figure 20:
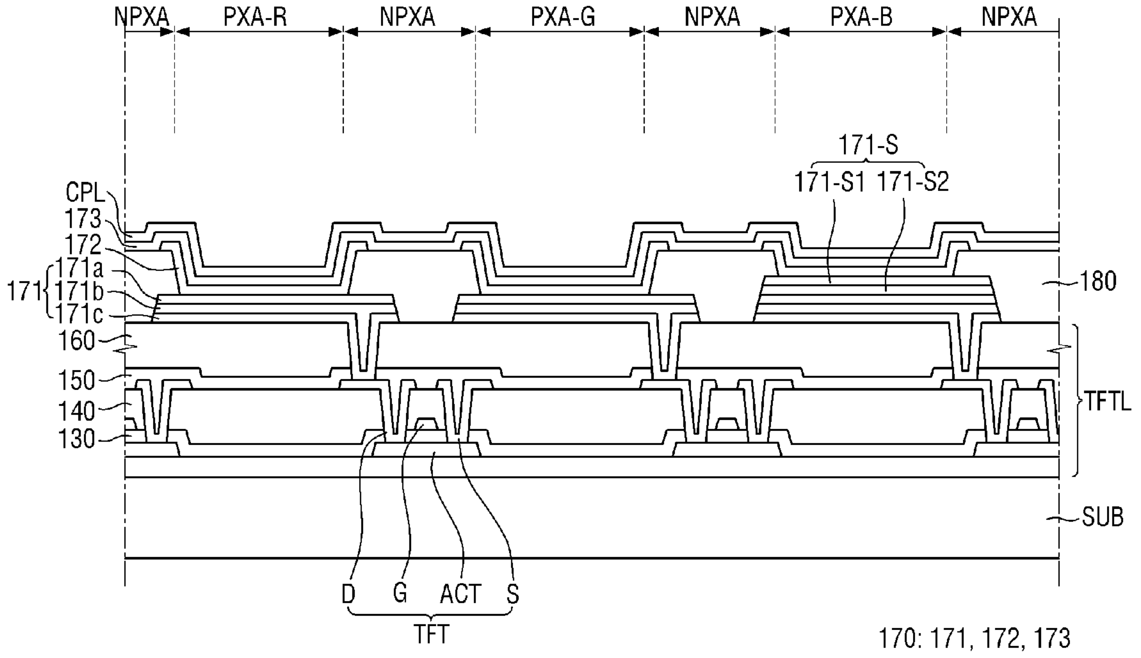

Subsequently, a capping layer CPL is disposed on the common electrode 173 with reference to FIG. 20. The material of the capping layer CPL is not particularly limited as long as it is typically used to form the capping layer CPL in the art. The capping layer CPL is formed to cover all of the emission areas.

As described above, the head-mounted display device including the display device according to the embodiment of the present disclosure can improve the luminous efficiency to the outside.

Figure 21:
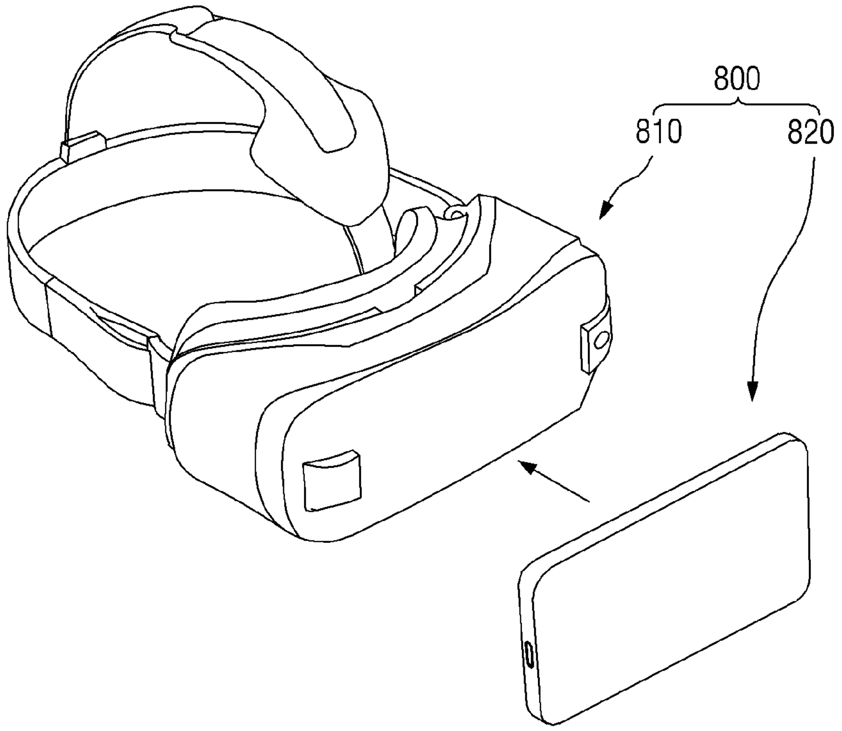
FIG. 21 is a view illustrating a head mount display device according to another embodiment of the present disclosure.

FIG. 21 is a view illustrating a head mount display device according to another embodiment of the present disclosure.

Referring to FIG. 21, a head mount display device 800 according to another embodiment of the present disclosure may include a head mount device 810 and a display device 820.

The head mount device 810 may be coupled to the display device 820. Here, the display device 820 may include a display panel having a plurality of display elements which display an image and a diffraction pattern layer which diffracts light emitted from the display elements. That is, the display device 820 may include one of the display devices described in this specification.

The head mount device 810 may include a connector for electrical connection with the display device 820, and a frame for physical connection therewith. Also, the head mount device 810 may include a cover for preventing an external impact and preventing separation of the display device 820.

That is, the head mount device 810 may be coupled to the display device 820, the display device 820 may include the diffraction pattern layer, and thus the effective light emission area may be enlarged to improve the screen door phenomenon.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display device comprising:

a substrate comprising a first area for emitting red light, a second area for emitting green light, and a third area for emitting blue light;

a first pixel electrode, a second pixel electrode and a third pixel electrode disposed in the first area, the second area and the third area, respectively, on the substrate, wherein the third pixel electrode includes a reflective material;

a sub-pixel electrode disposed only on the third pixel electrode disposed in the third area for emitting the blue light;

a first emissive layer, a second emissive layer and a third emissive layer disposed on the first pixel electrode, the second pixel electrode and the sub-pixel electrode, respectively; and a common electrode disposed on entireties of the first emissive layer, the second emissive layer and the third emissive layer, wherein the sub-pixel electrode comprises an upper sub-electrode made of a transparent metal material and a lower sub-electrode having a distance-adjusting function.

2. The display device of claim 1, wherein the upper sub-electrode is made of indium tin oxide (ITO) or HITO.

3. The display device of claim 2, wherein the lower sub-electrode is made of at least one of indium gallium zinc oxide (IGZO), indium zinc oxide (IZO), aluminum zinc oxide (AZO), and gallium zinc oxide (GZO).

4. The display device of claim 1, wherein the sub-pixel electrode has a total thickness of about 300 angstroms (Å) to about 1,000 Å.

5. The display device of claim 1, wherein the first emissive layer, the second emissive layer and the third emissive layer comprise a green emissive layer.

6. The display device of claim 5, wherein the third emissive layer has a stack structure of the green emissive layer and a blue emissive layer.

7. The display device of claim 6, wherein the first emissive layer has a stack structure of the green emissive layer and a red emissive layer, and wherein the second emissive layer has a single-layer structure of the green emissive layer.

8. The display device of claim 1, wherein the pixel electrode has a stack structure including a top pixel electrode and a lower pixel electrode, and wherein the top pixel electrode is made of a transparent conductive layer and disposed on a lower pixel electrode made of a metal material having relatively high reflectance.

9. The display device of claim 8, wherein the stack structure of the pixel electrode further includes a bottom pixel electrode made of a transparent conductive layer disposed under the lower pixel electrode.

10. The display device of claim 8, wherein the top pixel electrode has a thickness of about 30 Å to about 300 Å.

11. The display device of claim 1, further comprising:

a hole common layer disposed under each of the first emissive layer, the second emissive layer, and the third emissive layer; and an electron common layer disposed on each of the first emissive layer, the second emissive layer and the third emissive layer.

12. The display device of claim 11, wherein the hole common layer comprises at least one of a hole injection layer and a hole transport layer.

13. The display device of claim 11, wherein the electron common layer comprises at least one of an electron injection layer and an electron transport layer.

14. The display device of claim 1, further comprising:

a capping layer disposed on the common electrode.

15. A display device comprising:

a substrate comprising a first area for emitting red light, a second area for emitting green light, and a third area for emitting blue light;

a first pixel electrode, a second pixel electrode, and a third pixel electrode disposed in the first area, the second area, and the third area, respectively, on a substrate, wherein the third pixel electrode includes a reflective material;

a sub-pixel electrode disposed only on the third pixel electrode disposed in the third area for emitting the blue light;

a hole common layer disposed on the sub-pixel electrode;

an emissive layer disposed on the hole common layer;

an electron common layer disposed on the emissive layer; and a common electrode disposed on the electron common layer, wherein the emissive layer comprises a first emissive layer and a second emissive layer disposed on the first emissive layer.

16. The display device of claim 15, wherein the first emissive layer is a green emissive layer, and the second emissive layer is a blue emissive layer.

17. The display device of claim 15, wherein the sub-pixel electrode comprises an upper sub-electrode made of a transparent metal material and a lower sub-electrode having a distance-adjusting function.

18. The display device of claim 17, wherein the upper sub-electrode is made of a transparent metal material including ITO or HITO.

19. The display device of claim 17, wherein the lower sub-electrode is made of at least one of IGZO, IZO, AZO, and GZO.

20. The display device of claim 15, wherein the pixel electrode has a stack structure including a top pixel electrode and a lower pixel electrode, and wherein the top pixel electrode is made of a transparent conductive layer and disposed on a lower pixel electrode made of a metal material having relatively high reflectance.

21. The display device of claim 20, wherein the stack structure of the pixel electrode further includes a bottom pixel electrode made of a transparent conductive layer disposed under the lower pixel electrode.

* * * * *